United States Patent
Shkel et al.

(10) Patent No.: US 10,167,190 B2
(45) Date of Patent: Jan. 1, 2019

(54) LOW COST WAFER LEVEL PROCESS FOR PACKAGING MEMS THREE DIMENSIONAL DEVICES

(71) Applicant: The Regents of the University of California, Oakland, CA (US)

(72) Inventors: Andrei A. Shkel, Irvine, CA (US); Alexandra Efimovskaya, Irvine, CA (US); Doruk Senkal, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 19 days.

(21) Appl. No.: 15/432,880

(22) Filed: Feb. 14, 2017

(65) Prior Publication Data

US 2017/0233247 A1  Aug. 17, 2017

Related U.S. Application Data

(60) Provisional application No. 62/295,991, filed on Feb. 16, 2016.

(51) Int. Cl.
*B81B 7/00* (2006.01)
*B81C 1/00* (2006.01)
(Continued)

(52) U.S. Cl.
CPC ............ *B81B 7/0074* (2013.01); *B81B 7/007* (2013.01); *B81C 1/00269* (2013.01);
(Continued)

(58) Field of Classification Search
None
See application file for complete search history.

(56) References Cited

U.S. PATENT DOCUMENTS 3,237,061 A * 2/1966 Gaertner ............... H01L 23/049
257/684
4,882,212 A * 11/1989 SinghDeo .......... A61F 2/30965
174/256

(Continued)

OTHER PUBLICATIONS

Giner et al. "Design, fabrication, and characterization of a micromachined glass-blown spherical resonator with insitu integrated silicon electrodes and ALD tungsten interior coating," IEEE 28th Intl. Conf. on Micro Electro Mechanical Systems (MEMS), 2015, pp. 805-808.*

(Continued)

*Primary Examiner* — Erik T Peterson
(74) *Attorney, Agent, or Firm* — Marcus C. Dawes; Daniel L. Dawes

(57) ABSTRACT

An apparatus and method for wafer-level hermetic packaging of MicroElectroMechanical Systems (MEMS) devices of different shapes and form factors is presented in this disclosure. The method is based on bonding a glass cap wafer with fabricated micro-glassblown "bubble-shaped" structures to the substrate glass/Si wafer. Metal traces fabricated on the substrate wafer serve to transfer signals from the sealed cavity of the bubble to the outside world. Furthermore, the method provides for chip-level packaging of MEMS three dimensional structures. The packaging method utilizes a micro glass-blowing process to create "bubble-shaped" glass lids. This new type of lids is used for vacuum packaging of three dimensional MEMS devices, using a standard commercially available type of package.

18 Claims, 6 Drawing Sheets

(51) Int. Cl.
  *C03B 23/035* (2006.01)
  *B81C 3/00* (2006.01)
(52) U.S. Cl.
  CPC ...... *B81C 1/00634* (2013.01); *C03B 23/0352* (2013.01); *B81B 2207/097* (2013.01); *B81C 3/001* (2013.01); *B81C 2203/0109* (2013.01); *B81C 2203/019* (2013.01); *B81C 2203/0118* (2013.01); *B81C 2203/0172* (2013.01)

(56) References Cited

U.S. PATENT DOCUMENTS

| | | | | |
|---|---|---|---|---|
| 2006/0226758 | A1* | 10/2006 | Sofue | C09D 183/04 313/483 |
| 2007/0071922 | A1* | 3/2007 | Eklund | C03B 23/02 428/34.6 |
| 2008/0280124 | A1* | 11/2008 | Eklund | C03B 23/02 428/315.9 |
| 2012/0285198 | A1* | 11/2012 | Shang | C03B 19/08 65/22 |
| 2013/0214461 | A1* | 8/2013 | Shkel | G01C 19/5691 264/572 |
| 2013/0221497 | A1* | 8/2013 | Baillin | B81C 1/00285 257/629 |
| 2014/0021561 | A1* | 1/2014 | Trusov | B81C 1/00634 257/415 |
| 2016/0047653 | A1* | 2/2016 | Shkel | G01C 19/5691 73/504.13 |
| 2016/0194200 | A1* | 7/2016 | Najafi | C03B 23/02 65/106 |

OTHER PUBLICATIONS

Di Zhang et al., "A novel wafer level hermetic packaging for MEMS devices using micro glass cavities fabricated by a hot forming process," 2010 11th International Conference on Electronic Packaging Technology & High Density Packaging, Xi'an, 2010, pp. 921-924.*

* cited by examiner

LOW COST WAFER LEVEL PROCESS FOR PACKAGING MEMS THREE DIMENSIONAL DEVICES

RELATED APPLICATIONS

This application is related to provisional patent application, entitled, A LOW-COST WAFER LEVEL PROCESS FOR PACKAGING MEMS THREE DIMENSIONAL DEVICES, Ser. No. 62/295,991, filed on Feb. 16, 2016, under 35 USC 119, which is incorporated herein by reference.

BACKGROUND

Field of the Technology

The invention relates to the field of semiconductor packaging, and more specifically to a package for a micro-electromechanical device. The state-of-the-art packaging technology is suitable for hermetic packaging of MEMS devices of different shapes and form factors, in particular three dimensional MEMS devices, such as a folded MEMS timing inertial measurement unit (TIMU) and MEMS atomic navigator.

Description of the Prior Art

Packaging for Micro-electromechanical systems (MEMS) and Integrated circuits (IC) is one of the most important manufacturing steps before bringing the product into the market. It is also the most expensive process in micromachining. The package provides the interface between the components and the overall system as well as servers for establishing an appropriate operating environment. Some MEMS devices can require specialized packages or packaging processes. For example, inertial sensors need to be hermetically sealed in order to protect the moving parts from environmental effect such as humidity and dust. In addition, most MEMS gyroscopes, oscillators and resonant type accelerometers require vacuum encapsulation. Therefore, unlike electronic packaging, where a standard package can be used for a variety of applications, MEMS packages tend to be customized.

Various packaging technologies have been developed for Integrated Circuits and MEMS. These can be grouped under two major categories according to fabrication process: Chip-level packaging as seen in FIG. 1a and wafer-level packaging as seem in FIG. 1b. Chip-level packaging allows for an improved time to market due to the capability of using a standard type of package. However, wafer-level packaging is generally more cost effective.

Chip-level packaging category includes all commercially available metal packages, ceramic and plastic packages. Different companies offer a wide range of standard metal, ceramic, and plastic packages for different MEMS/IC applications. This includes surface mount packages/surface mount devices (SMD), pin grid array packages (PGA), dual-in-line packages (DIP), leadless chip carriers (LCC), flat packs (F/P), and chip scale packages (CSP). Generally, the device is a die attached to the bottom of the package cavity, wire bonded to the bond pads and hermetically sealed using a lid. Commercially available packages usually come with flat ceramic, metal or glass lids.

Wafer-level packaging category includes thin film packaging and packaging, based on hermetic wafer-to-wafer bonding techniques. Various approaches have been developed for wafer-level thin film packaging of MEMS devices. In the prior art, an article entitled "A Low-Temperature Thin-Film Electroplated Metal Vacuum Package", by Brian H. Stark and Khalil Najafi, Journal of Microelectromechanical Systems, vol. 13, No 2, April 2004, proposes an idea of a packaging technology that employs an electroplated nickel film to vacuum seal a MEMS structure on wafer level. The package is fabricated in a low-temperature 3-mask process by electroplating a 40 µm thick nickel film over an 8 µm sacrificial photoresist that is removed prior to package sealing.

Another example of the prior art, an article entitled "Mechanical Design and Characterization for MEMS Thin-Film Packaging" by Fabio Santagata et al., Journal of Microelectromechanical Systems, vol. 21, No. 1, February 2012, describes a thin-film encapsulation approach, using a 6 µm thick low-pressure chemical vapor deposited (LPCVD) silicon nitride capping layer and a silicon oxide sacrificial layer.

A number of approaches for hermetic packaging based on wafer-to-wafer bonding techniques have been described in literature, U.S. Pat. No. 8,685,776 B2 discloses a method for manufacturing hermetically sealed MEMS device. Fabrication process starts with etching the device layer of the first SOI wafer and releasing the sensor mechanical features, using hydrogen fluoride (HF) etching. The silicon cover wafer is then fusion or Au-eutectic bonded to the SOI wafer. Next, the handle layers of the cover wafer and the bottom SOI wafer are etched, using a conventional wet etching process. Metallization is then applied to form an electrical connection with the encapsulated device.

A successful wafer-level packaging method for integrated MEMS with CMOS has been introduced by S. Nasiri et at in U.S. Pat. US20050166677. The Nasiri-fabrication process involves fabrication of a silicon-on-insulator (SOI) wafer, where cavities are formed in the handle layer. The MEMS device is defined in the device layer, using DRIE. Then, the SOI wafer with the device definition is bonded directly to the Al electrical contact pads on the bottom CMOS wafer.

Yu-T. Cheng et at in "Vacuum Packaging Technology Using Localized Aluminum/Silicon-to-Glass Bonding", Journal of Microelectromechanical Systems, vol. 11, No. 5, October 2002, describe a glass vacuum packaging method utilizing aluminum/silicon-to-glass bonding process. The packaging process starts with forming, the polysilicon interconnect line and microheater, followed by deposition of an oxide/nitride/oxide sandwich layer for electrical insulation. Next, aluminum and polysilicon layers are deposited and pattered. A Pyrex glass capsule is then bonded on top of the device substrate.

BRIEF SUMMARY

The illustrated embodiments of the invention disclose an approach for hermetic packaging of MEMS devices of different shapes and form factors. The packaging method utilizes a micro glass-blowing process for fabrication of three dimensional "bubble-shaped" glass structures. Three dimensional glass structures are used for hermetic sealing of MEMS devices on wafer-level or on chip-level.

As a demonstration of using the novel packaging method, three dimensional MEMS TIMU device in 50 mm$^3$ volume was packaged, using the LCC standard package and the "bubble-shaped" glass lid. While the preferred process flow for fabrication of the "bubble-shaped" glass structures and "substrate" wafer has been illustrated and described, many changes can be made without departing from the spirit and scope of the invention. Fabrication steps described and claimed may be performed in a different order. For example, metal deposition can be performed before bonding the cap wafer or after glassblowing step. Accordingly, the scope of the invention is not limited by the disclosure of the preferred process flow.

More generally, the illustrated embodiments of the invention include a method for wafer-level vacuum packaging of a MEMS three dimensional device including the steps of: fabricating a "bubble-shaped" glass structure on a wafer-level, using a glassblowing process with sealing rings for coupling between the structure and metal traces and/or substrate wafer; disposing metal traces on the substrate wafer; disposing a three dimensional MEMS device on the substrate wafer using flip-chip bonding with interconnects to the MEMS device; disposing the "bubble-shaped" structure as a cap wafer over the MEMS device on the substrate wafer; and bonding the cap wafer to the substrate wafer.

The step of fabricating a "bubble-shaped" glass structure on a wafer-level, using a glassblowing process with sealing rings for coupling between the structure and metal traces and/or substrate wafer includes the steps of: selectively defining a cavity in a first handle wafer having a first and second opposing surface; bonding a glass cap wafer onto the handle wafer on the first surface to form a cap-handle wafer stack; forming metallization on the handle wafer on a second opposing surface; heating the cap-handle wafer stack as to allow pressure buildup within the cavity causing plastic deformation of the cap wafer; and removing the handle wafer to open the cavity.

The step of bonding the cap wafer to the substrate wafer includes the step of hermetically sealing the cap-handle wafer stack to the substrate wafer.

The step of removing the handle wafer to open the cavity includes the step of removing the handle wafer by wet chemical etching the handle wafer using a metal etch mask.

The step of removing the handle wafer to open the cavity includes the step of removing the handle wafer by anisotropic dry etching the handle wafer.

The step of removing the handle wafer to open the cavity includes the step of removing the handle by lapping wafer stack on the second opposing surface.

The step of forming metallization on the handle wafer on a second opposing surface is performed before bonding a glass cap wafer onto the handle wafer on the first surface to form a cap-handle wafer stack.

The step of forming metallization on the handle wafer on a second opposing surface is performed after fabricating a "bubble-shaped" glass structure on a wafer-level, using a glassblowing process with sealing rings for coupling between the structure and metal traces and/or substrate wafer.

The step of disposing the "bubble-shaped" structure as a cap wafer over the MEMS device on the substrate wafer includes the step of disposing the "bubble-shaped" structure by a flip-chip bonding process.

The step of removing the handle wafer to open the cavity further includes the step of removing the handle wafer and then disposing a thin-film deposition layer of getter material.

The step of bonding the cap wafer to the substrate wafer includes the step of producing a hermetic seal by bonding the cap-handle wafer stack to the substrate wafer in vacuum.

The step of disposing metal traces on the substrate wafer includes the steps of selectively disposing a first metal layer, selectively disposing an insulating layer on the first metal layer, and selectively disposing a second metal layer on the insulating layer.

The step of disposing a thin-film deposition layer of getter material includes the step of disposing a thin-film deposition layer of getter material a getter layer on the handle side of the microglassblown cap wafer before bonding a glass cap wafer onto the handle wafer on the first surface to form a cap-handle wafer stack and where a hermetic seal is formed thereafter.

The scope of the illustrated embodiments of the invention also extend to include a method for fabrication of lids for a chip-level hermetic packaging of MEMS device of varying shape and form factor. The method includes the steps of: providing a handle wafer; creating cavities on a handle wafer; bonding a cap wafer onto the handle wafer to form a cap-handle stack; forming a metallization on the handle wafer; heating the cap-handle wafer stack as to allow pressure buildup within the cavity causing plastic deformation of the cap wafer; and removing the handle wafer to open the cavity.

The step of creating cavities on a handle wafer includes the step of microglassblowing a bubble in the cap wafer.

The step of bonding a cap wafer onto the handle wafer to form a cap-handle stack includes the step of anodically bonding a borosilicate glass wafer to a silicon wafer.

The step of microglassblowing a bubble in the cap wafer includes the step of microglassblowing a bubble in the cap wafer with a diameter of 10 mm or greater at at least 134 Torr pressure.

The step of microglassblowing a bubble in the cap wafer includes the step of microglassblowing a bubble with a height of 6.8 mm or less so that removing the handle wafer to open the cavity does not break the bubble.

The illustrated embodiments of the invention also include a MEMS device, chip-level hermetic packaging. The packaging includes: a substrate wafer; a patterned metallization disposed on the substrate wafer; a glass bubble cap wafer hermetically sealed to the substrate wafer; and a MEMS device of variable shape and form factor disposed on the substrate wafer, coupled to the patterned metallization, disposed within the glass bubble cap wafer and hermetically sealed therein. The packaging is fabricated by: providing a handle wafer; creating cavities on a handle wafer; bonding a cap wafer onto the handle wafer to form a cap-handle stack; forming a metallization on the handle wafer; heating the cap-handle wafer stack as to allow pressure buildup within the cavity causing plastic deformation of the cap wafer; and removing the handle wafer to open the cavity.

The packing is fabricated by including a step where heating the cap-handle wafer stack as to allow pressure buildup within the cavity causing plastic deformation of the cap wafer comprises microglassblowing a bubble in the cap wafer with a diameter of 10 mm or greater at at least 134 Torr pressure and a height of 6.8 mm or less so that removing the handle wafer to open the cavity does not break the bubble.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

BRIEF DESCRIPTION OF THE DRAWINGS

FIG. 4a shows the step of laying down a photoresist mask. FIG. 4b illustrates a Si DRIE etching step to define a cavity. FIG. 4c illustrates a step of glass wafer anodic bonding. FIG. 4d illustrates a step of metal deposition and patterning. FIG. 4e shows a step of glass-blowing and FIG. 4f a step of Si wet etching.

The disclosure and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION OF THE PREFERRED EMBODIMENTS

Figure 1A:
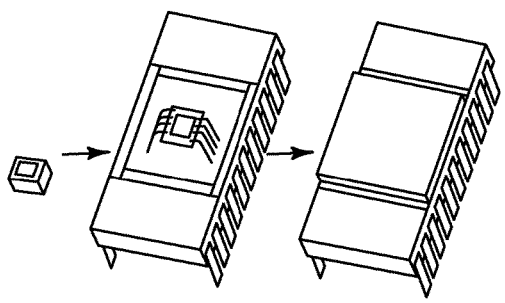
FIGS. 1a and 1b are diagrams of prior art MEMS packaging approaches.
Figure 1B:
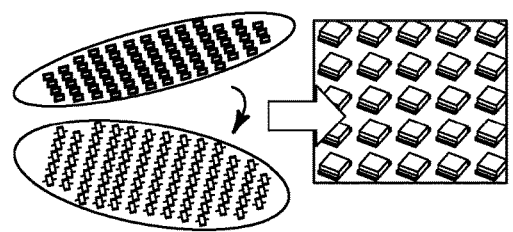
Figure 2A:
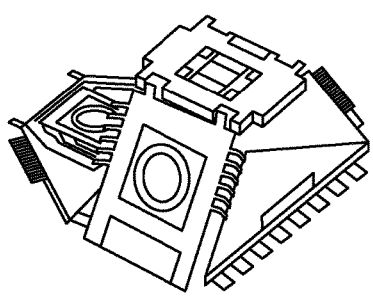
FIGS. 2a and 2b are photographs of prior art three dimensional MEMS devices.
Figure 2B:
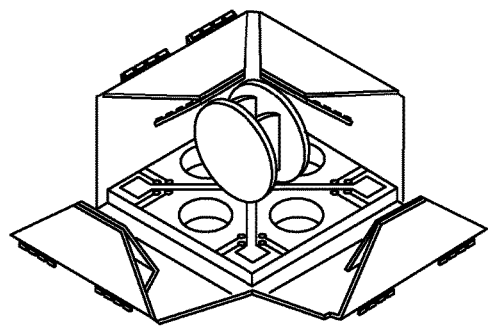

As a demonstration of using the packaging method of the illustrated embodiments of the invention, a 50 mm$^3$ three dimensional MEMS TIMU device as shown in FIG. 2a was packaged, using the LCC standard package and a "bubble shaped" glass lid. Recent developments in the MEMS processing enable building complex-shaped three dimensional MEMS structures, including those using polymers to create three dimensional elements. One example of a three dimensional MEMS device is a folded mems inertial measurement unit (IMU), as seen in FIG. 2a. Folded IMU approach is based on wafer-level fabrication of planar structures with in-situ fabricated single-axis inertial sensors. These structures are then folded in a three dimensional shape, using co-fabricated polyimide flexible hinges. Another example is a chip-scale combinatorial atomic navigator, as seen in FIG. 2b. The device is assembled into a three dimensional configuration with Helmholtz coils and Rb vapor cell inside a three dimensional structure. Optical components and inertial sensors are integrated on the side walls of the folded pyramid.

A large variety of shapes and form factors of MEMS devices makes it difficult to use standard wafer-level packaging techniques and standard packages. For example, common wafer-level packaging techniques are not suitable for packaging of MEMS three dimensional devices, such as the folded MEMS TIMU. Wafer-level thin-film encapsulation approach is not compatible with three dimensional MEMS structures due to a limited thickness of a sacrificial layer, which defines the height of the microcavity. Packaging approaches based on hermetic wafer-to-wafer bonding techniques successfully address the most of the packaging needs of the flat MEMS devices. However, in order to use these approaches for packaging of three dimensional MEMS structures, sophisticated fabrication steps are required, such as etching deep cavities in the handle Si/glass wafers (up to 10 mm deep). In order to use a standard package for packaging three dimensional MEMS structures, significant modification in package geometry is needed. This includes the increased depth of the package cavity (up to 10 mm deep). Using a customized package can result in increased cost of the final product.

It is therefore desirable to develop a new hermetic packaging method for three dimensional MEMS devices, such as for folded MEMS TIMUs. Our approach utilizes a microglass-blowing process for wafer-level packaging of three dimensional MEMS devices, based on bonding a glass cap wafer with fabricated "bubble-shaped" glass structures to the handle glass/Si wafer. Metal traces fabricated on the handle wafer serve to transfer signals from the sealed cavity of the bubble to the outside world. The illustrated embodiments of the present invention also provide a method for chip-level packaging of MEMS three dimensional devices, using "bubble-shaped" glass lids and standard commercially available type of packages.

Figure 3:
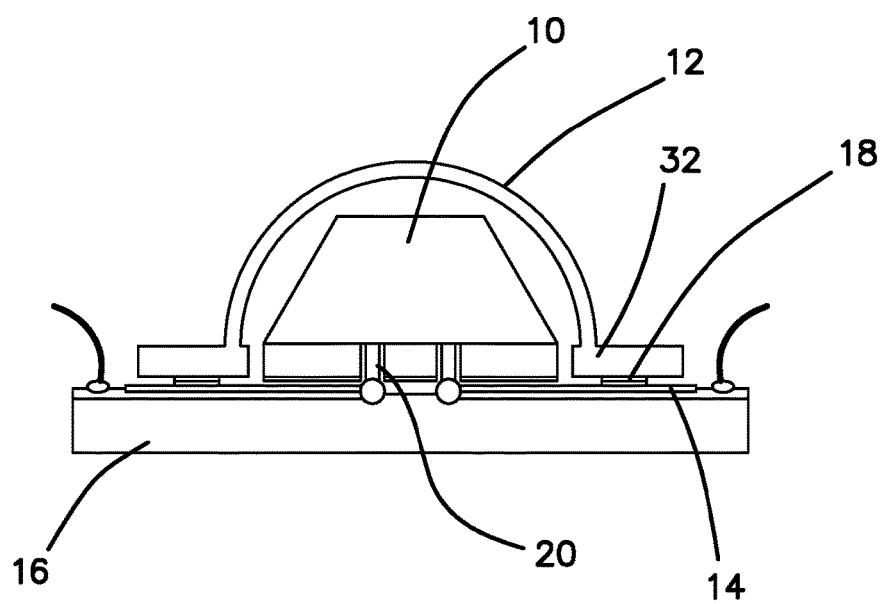
FIG. 3 is a side cross-sectional view of a hermetically sealed three dimensional MEMS device.
Figure 7:
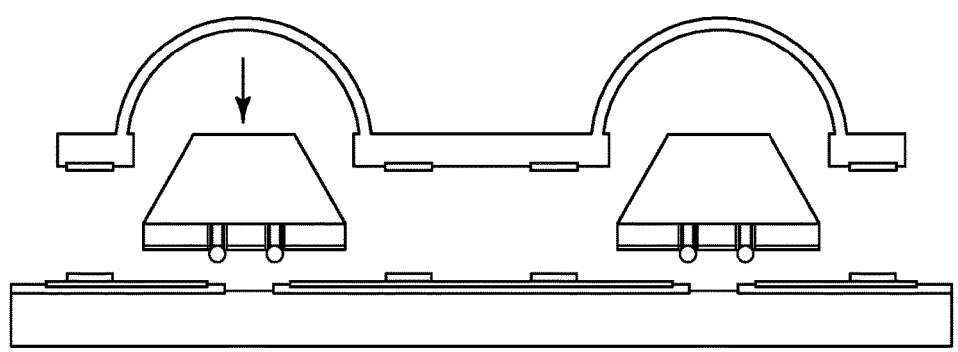
FIG. 7 is an exploded diagram of the wafer-level packaging of three dimensional MEMS devices.

Consider first wafer-level vacuum packaging of MEMS three dimensional devices. We introduce a new method for wafer-level vacuum packaging of MEMS three dimensional devices. Our approach is based on using a micro glass-blowing technique to fabricate the glass "bubble-shaped" structures on wafer level. Three dimensional MEMS devices 10 are hermetically sealed by bonding a glass cap wafer 12 with "bubble-shaped" structures to the handle glass/Si wafer, as seen in FIG. 3. The packaging process involves four steps:

a. "bubble-shaped" glass structures 12 are fabricated on wafer-level, using glassblowing process with sealing rings 18 between structure 12 and metal traces 14 or wafer 16 below;

b. metal traces 14 are deposited on the "substrate" wafer 16;

c. three dimensional MEMS devices 10 are attached to the "substrate" wafer 16, using flip-chip bonding with interconnects 20 to device 10;

d. "cap" wafer with bubble-shaped structures 12 is bonded to the "substrate" wafer 16.

Figure 4A:
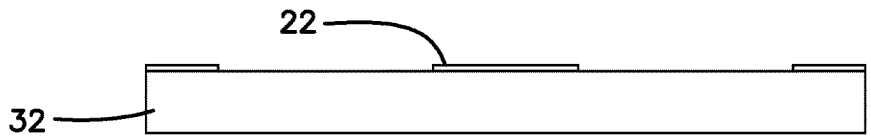
FIGS. 4a-4f are side cross-sectional diagrams illustrating the "bubble-shaped" glass structures fabrication process steps.
Figure 4B:
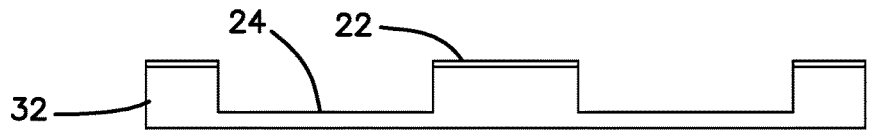
Figure 4C:
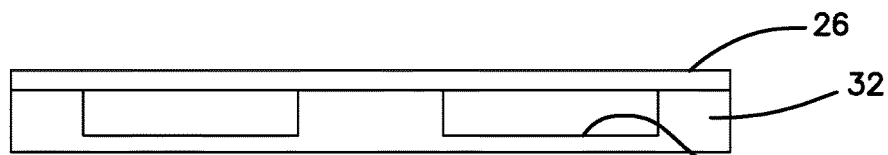
Figure 4D:
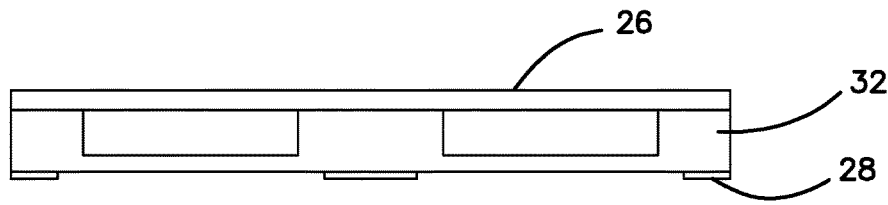
Figure 4E:
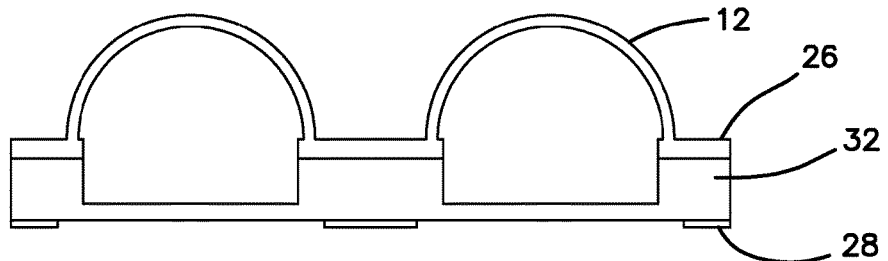
Figure 4F:
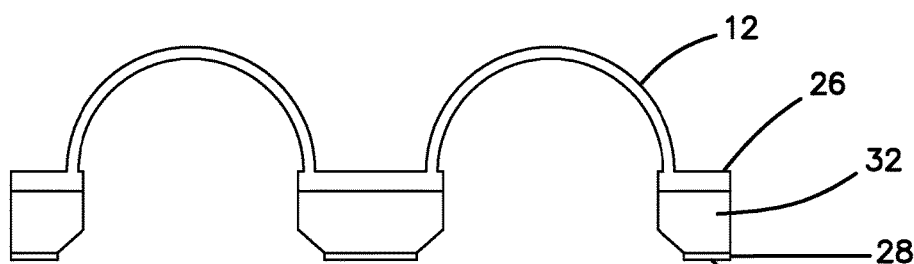

Wafer-level fabrication process for the "bubble-shaped" glass structures 12 starts with patterning a 1 mm thick silicon wafer 32 with a layer of photoresist 22, as illustrated in FIG. 4a. 700 μm deep cavities 24 are then etched using deep reactive ion Etching (DRIE), as seen in FIG. 4b. The photoresist 22 is removed with acetone and a 100 μm thin borosilicate glass wafer 26 is anodically bonded to the silicon wafer 32, as seen in FIG. 4c. This is followed by deposition and patterning a metal hard mask 28 for the subsequent Si wet etching process, as seen in FIG. 4d. Gold, chromium or titanium can be used as masking material. Next, the bonded wafers are placed inside a furnace at 350 Torr pressure and at an 850° C. temperature (above the softening point of the glass). Under the high temperature, the pressure of the trapped air inside the cavities 24 increases and the glass deforms into spherical shapes 12, as seen in FIG. 4e. The samples are then quickly removed from the furnace and cooled down to the room temperature. Once glass-blowing step is complete a 300 μm layer of the silicon handle wafer 32 is removed, using wet etching process and the metal etch mask 28 defined at the previous step, as seen in FIG. 4f. Ethylenediamine pyrocatechol (EDP)-based etchant, or KOH-based etchant can be used for this purpose. This is followed by deposition of 5000 Å thick gold layer 30 on top of the 500 Å thick chromium adhesion layer 28. Metal is then patterned to define a seal ring 18 for subsequent wafer bonding.

Figure 5:
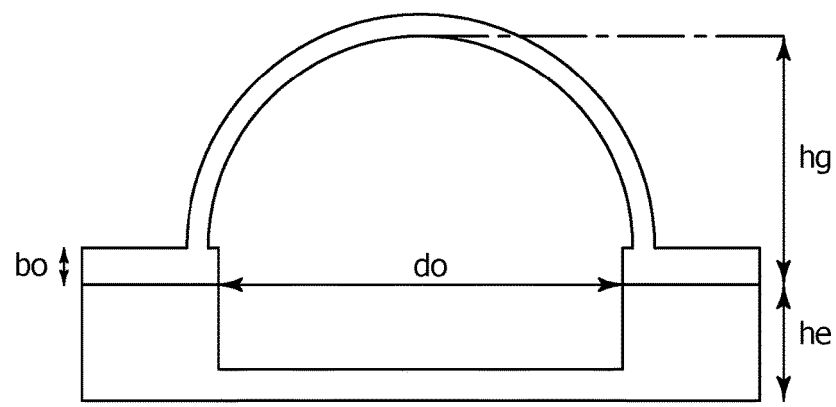
FIG. 5 is a side cross-sectional diagram of the geometry of the blown structure.
Figure 6A:
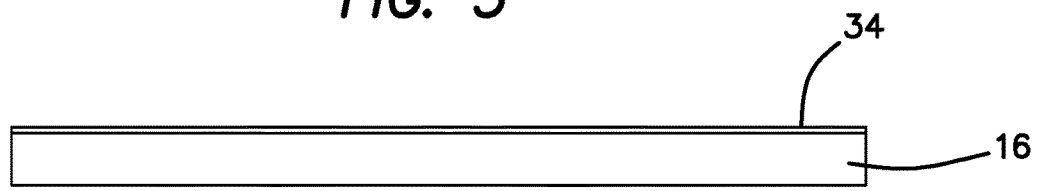
FIGS. 6a-6d are side cross-sectional diagrams illustrating the fabrication process for the "substrate" wafer.
Figure 6B:
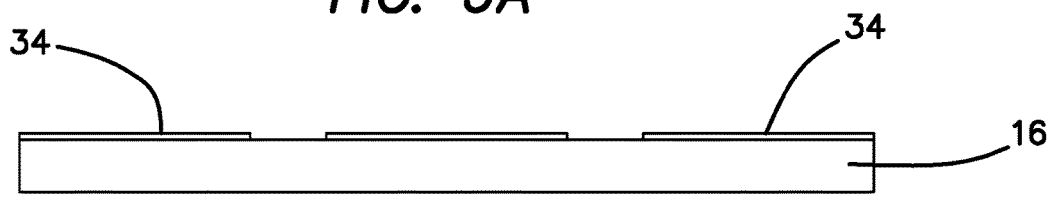
Figure 6C:
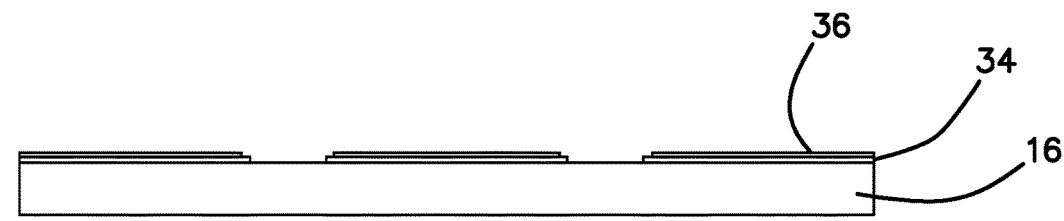
Figure 6D:
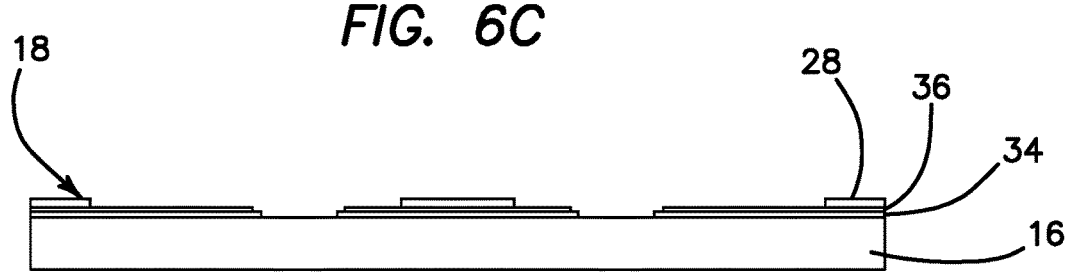

An analytical model developed in the art was used to predict the shape of the bubble 12. Glass-blowing takes place inside the furnace at 350 Torr pressure and 850 C temperature. The predicted geometry of the bubbles 12 for different diameters of the etched cavities 24 are summarized in Table 1. FIG. 5 shows a cavity 24 diameter of $d_0$, a height hg of the bubble 12, a substrate wafer 16 thickness of he and ring seal 18 thickness $b_0$.

TABLE 1

Predicted height of the blown structures.

| Diameter of a cavity, d0, mm | Height of a blown bubble, hg, mm |
|---|---|
| 8.6 | 6.2 |
| 9.6 | 6.5 |
| 10.6 | 6.8 |
| 11.6 | 7.0 |

A process flow diagram for the "substrate" wafer 16 is shown in FIG. 6. First, a 500 Å adhesion layer of chrome and a 5000 Å thick gold layer, collectively denoted by reference numeral 34, is deposited on the glass wafer, as seen in FIG. 6a. Metal layers 34 are then patterned in order to define the interconnection traces features, as seen in FIG. 6b. Metal traces serve to transfer signals from the sealed cavity of the bubble 12 to the outside world. A silicon nitride layer 36 is than deposited to provide electrical insulation, as seen in FIG. 6c. Next, we deposit another 500 Å adhesion layer of chrome and 5000 Å layer of gold, collectively denoted by reference numeral 38 and pattern these layers in order to define the seal ring features 18, as seen in FIG. 6d.

Once fabrication process is complete, the three dimensional MEMS devices 10 are attached to the "substrate" wafer 16, using flip-chip bonding and hermetically sealed by bonding a cap wafer with the "bubble-shaped" structures 12 to the "substrate" wafer 16. Sealing can be performed in vacuum, using gold eutectic bonding. Thin-film getter layer can be deposited inside the bubbles 12 in order to maintain a high vacuum inside a hermetically sealed cavity.

Figure 8:
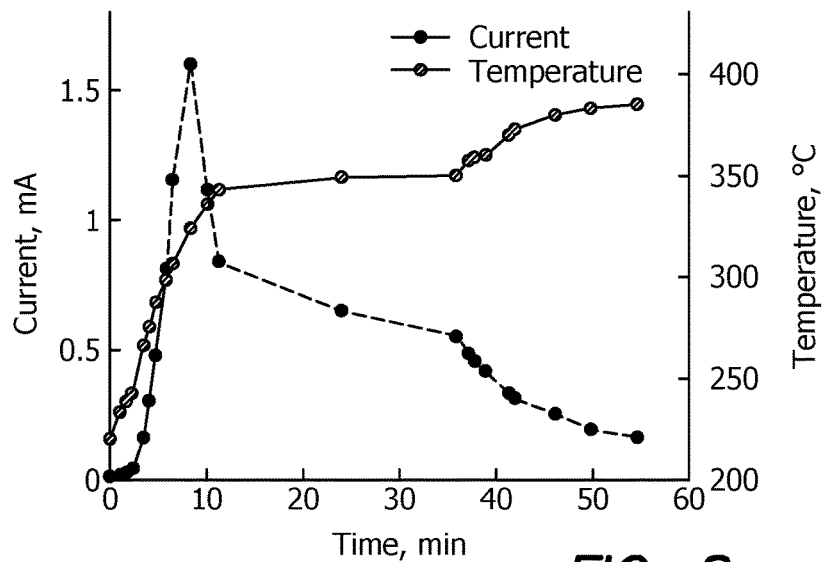
FIG. 8 is a graph of the time and temperature/current to anodically bond 100 μm thin borosilicate glass wafer to the Si wafer.
Figure 9:
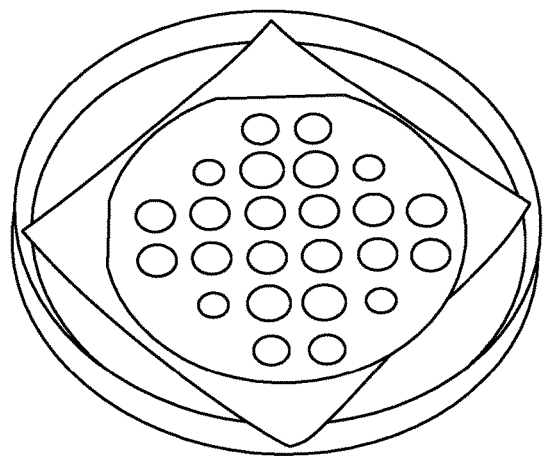
FIG. 9 is a photograph of 100 μm thin borosilicate glass wafers anodically bonded to the Si wafer.
Figure 10:
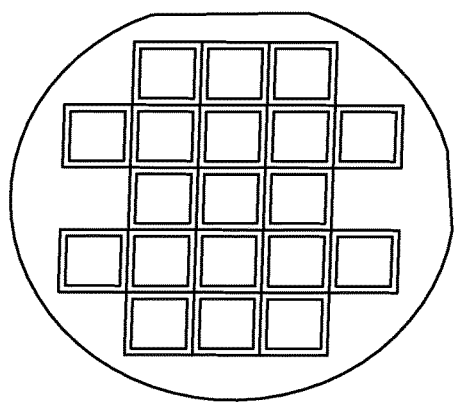
FIG. 10 is a photograph of a gold hard mask on the Si side of the glass-to-Si wafer stack.
Figure 11:
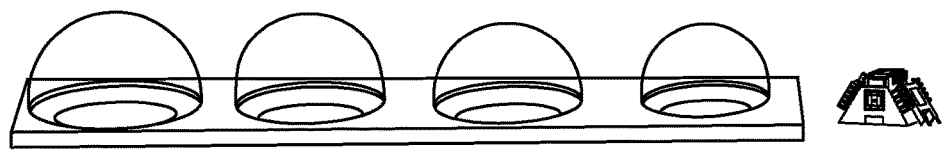
FIG. 11 is a photograph of glass bubbles blown at pressure in the range of 134 Torr-262 Torr. The height of the bubble exceeds 10 mm. 50 mm$^3$ three dimensional MEMS TIMU for the scale.
Figure 12:
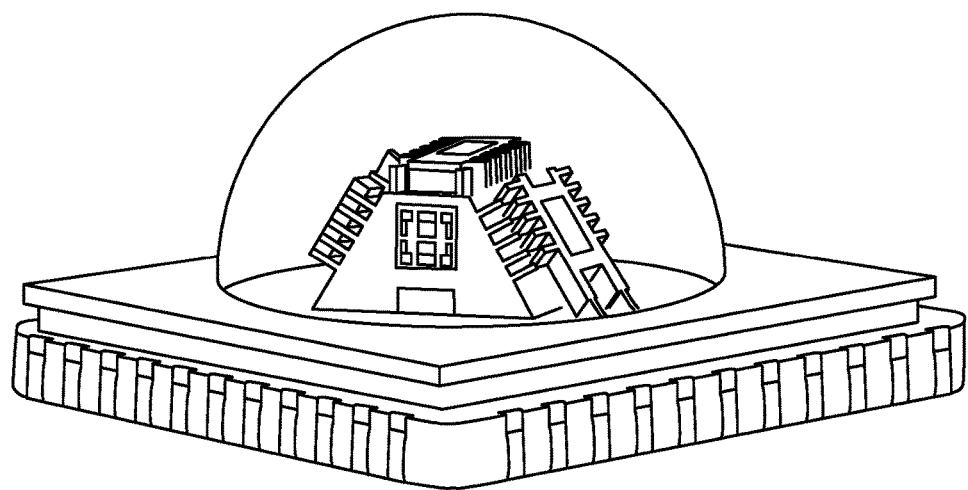
FIG. 12 is a photograph of a 50 mm$^3$ three dimensional MEMS IMU packaged, using the LCC standard package and the "bubble-shaped" glass lid.

Consider a new type of lid for chip-level vacuum packaging of MEMS three dimensional devices 10. In a chip-level vacuum packaging method in accordance with the illustrated embodiments of the present invention, a micro glass-blowing technique is utilized to fabricate the glass bubbles 12 on a wafer level. Three dimensional MEMS devices 10 are hermetically sealed, using glass "bubble shaped" lids 12 and standard commercially available packages. "Bubble-shaped" glass lids 12 fabrication process is similar to the one used for the wafer-level packaging and has been described above in connection with FIGS. 4a-4f. Packaging of MEMS three dimensional device 10 is performed by gold eutectic bonding in vacuum of the fabricated lids 12 to the standard package, such as an LCC package, DIP package, etc. Following the process flow described in FIGS. 4a-4f, the "bubble-shaped" glass structures 12 for chip-level vacuum packaging of MEMS three dimensional structures were successfully built. In a first step, 1 mm thick double-sided Si wafers 32 were spin-coated with an AZ P4620 photoresist 22 and the mask for the DRIE etch was photolithographically defined, similar to that shown in FIG. 4a. In the next step, 700 μm deep cavities 24 were DRIE etched, like that seen in FIG. 4b. A 100 μm thin borosilicate glass wafer 26 was then anodically bonded to the silicon wafer 32, covering all the etched cavities 24, like that shown in FIG. 4c. In the anodic bonding procedure, the wafers 26, 32 were assembled together and heated on a hotplate to about 400° C. The bonding profile is shown in the graph of FIG. 8. When an electric field is applied across the assembly, the current in the circuit starts increasing indicating that the bonding process has started. The current reaches 1.6 mA at a temperature of 324° C. and then starts decreasing indicating that the bonding is complete. FIG. 9 is a photograph of a batch which illustrates the stack of the glass-Si wafers as would be seen at FIG. 4c. A 500 Å seed layer of Cr followed by 2 μm thick layer of gold was deposited and patterned on the Si side of the glass-to-Si wafer stack, resulting in the stack as shown by the photograph of FIG. 10. Next, the bonded wafers were placed inside a furnace at an 850° C. temperature (above the softening point of the glass). The samples were blown at pressure in the range of 134 Torr-262 Torr, FIG. 11. The height of the glass-blown lids exceeded 10 mm for blowing at 134 Torr pressure. The samples blown at lower pressure break during the cooling process. Once the blowing process was complete, the 300 μm Si handle wafer 32 was etched in order to open the bubble cavity 12, like that shown in FIG. 4f. Samples with a bubble height less than 6.8 mm were successfully etched, using KOH solution. Samples with larger height bubbles break during KOH etch. A deep reactive ion etch (DIRE) was performed on these samples to open the bubble cavity. A 500 Å seed layer of Cr followed by 2 μm thick layer of gold 38 was then deposited using a shadow mask. Gold pattern defines the seal ring 18. A 50 mm³ three dimensional MEMS TIMU 10 was then packaged, using the LCC standard package and the "bubble shaped" glass lid, as shown in the photograph of FIG. 12. The diameter of the bubble exceeds 10 mm.

Many alterations and modifications may be made by those having ordinary skill in the art without departing from the spirit and scope of the embodiments. Therefore, it must be understood that the illustrated embodiment has been set forth only for the purposes of example and that it should not be taken as limiting the embodiments as defined by the following embodiments and its various embodiments.

Therefore, it must be understood that the illustrated embodiment has been set forth only for the purposes of example and that it should not be taken as limiting the embodiments as defined by the following claims. For example, notwithstanding the fact that the elements of a claim are set forth below in a certain combination, it must be expressly understood that the embodiments includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the embodiments is explicitly contemplated as within the scope of the embodiments.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the embodiments.

We claim:

1. A method for wafer-level vacuum packaging of a MEMS three dimensional device comprising:
   glassblowing a spherical glass structure on a wafer-level in a cap wafer, using sealing rings for coupling between the structure and metal traces and/or substrate wafer;
   disposing metal traces on the substrate wafer;
   disposing a three dimensional MEMS device on the substrate wafer using flip-chip bonding with interconnects to the MEMS device;
   disposing the cap wafer over the MEMS device on the substrate wafer; and
   bonding the cap wafer to the substrate wafer to form a cap-handle wafer stack.

2. The method of claim 1 where glassblowing a spherical glass structure on a wafer-level, using sealing rings for coupling between the structure and metal traces and/or substrate wafer comprises:
   selectively defining a cavity in a handle wafer having a first surface and an opposing second surface;
   bonding a glass cap wafer onto the handle wafer on the first surface to form a cap-handle wafer stack;
   forming metallization on the handle wafer on the second surface;
   heating the cap-handle wafer stack as to allow pressure buildup within the cavity causing plastic deformation of the cap wafer; and
   removing a layer of the handle wafer disposed beneath the deformation of the cap wafer to open the cavity.

3. The method of claim 1 where bonding the cap wafer to the substrate wafer comprises hermetically sealing the cap-handle wafer stack to the substrate wafer.

4. The method of claim 2 where removing a layer of the handle wafer disposed beneath the deformation of the cap wafer to open the cavity comprises removing the handle wafer disposed beneath the deformation of the cap wafer by wet chemical etching the handle wafer using a metal etch mask.

5. The method of claim 2 where removing the handle wafer to open the cavity comprises removing the handle wafer by anisotropic dry etching the handle wafer.

6. The method of claim 2 where removing a layer of the handle wafer disposed beneath the deformation of the cap wafer to open the cavity comprises removing the handle wafer disposed beneath the deformation of the cap wafer by lapping the cap-handle wafer stack on the second opposing surface disposed beneath the deformation of the cap wafer.

7. The method of claim 2, where forming metallization on the handle wafer on the second surface is performed before bonding the glass cap wafer onto the handle wafer on the first surface to form the cap-handle wafer stack.

8. The method of claim 2, where forming metallization on the handle wafer on the second surface is performed after glassblowing the spherical glass structure on a wafer-level, using sealing rings for coupling between the structure and metal traces and/or substrate wafer.

9. The method of claim 1 where disposing the spherical glass structure as a cap wafer over the MEMS device on the substrate wafer comprises disposing the MEMS device on the substrate wafer by a flip-chip bonding process.

10. The method of claim 2, where removing the handle wafer to open the cavity further comprises removing the handle wafer and then disposing a thin-film deposition layer of getter material.

11. The method of claim 2 where bonding the cap wafer to the substrate wafer comprises producing a hermetic seal by bonding the cap-handle wafer stack to the substrate wafer in vacuum.

12. The method of claim 1 where disposing metal traces on the substrate wafer comprises selectively disposing a first metal layer, selectively disposing an insulating layer on the first metal layer, and selectively disposing a second metal layer on the insulating layer.

13. The method of claim 10, where disposing the thin-film deposition layer of getter material comprises disposing the thin-film deposition layer of getter material on the cap wafer before bonding the cap wafer onto the handle wafer on the first surface to form the cap-handle wafer stack and where a hermetic seal is formed thereafter.

14. A method for fabrication of lids for a chip-level hermetic packaging of MEMS device of varying shape and form factor, comprising:
   providing a handle wafer;
   creating cavities into a handle wafer;
   bonding a cap wafer onto the handle wafer to form a cap-handle wafer stack;
   forming a metal hard mask on the handle wafer;
   heating the cap-handle wafer stack in a furnace as to allow pressure buildup within the cavity causing plastic deformation of the cap wafer; and
   removing portions of the handle wafer defined by the metal hard mask to open the cavity.

15. The method of claim 14 where creating cavities into a handle wafer comprises microglassblowing a bubble in the cap wafer.

16. The method of claim 14 where bonding a cap wafer onto the handle wafer to form a cap-handle stack comprises anodically bonding a borosilicate glass wafer to a silicon wafer.

17. The method of claim 14 where heating the cap-handle wafer stack as to allow pressure buildup within the cavity causing plastic deformation of the cap wafer comprises microglassblowing a bubble in the cap wafer with a diameter of 10 mm or greater at at least 134 Torr pressure within the furnace.

18. The method of claim 17 where microglassblowing a bubble in the cap wafer comprising microglassblowing a bubble with a height of 6.8 mm or less so that removing the handle wafer to open the cavity does not break the bubble.

* * * * *